（12） United States Patent
Kasahara et al.

(10) Patent No.: US 9,696,628 B2
(45) Date of Patent: Jul. 4, 2017

(54) PATTERN FORMING METHOD

(71) Applicant: KABUSHIKI KAISHA TOSHIBA, Tokyo (JP)

(72) Inventors: Yusuke Kasahara, Kanagawa (JP); Hideki Kanai, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/067,951

(22) Filed: Mar. 11, 2016

(65) Prior Publication Data

US 2017/0076940 A1 Mar. 16, 2017

(30) Foreign Application Priority Data

Sep. 11, 2015 (JP) .................................. 2015-179535

(51) Int. Cl.
*G03F 7/40* (2006.01)
*H01L 21/027* (2006.01)
(Continued)

(52) U.S. Cl.
CPC ............. *G03F 7/40* (2013.01); *B81C 1/00031* (2013.01); *G03F 7/002* (2013.01); *G03F 7/0035* (2013.01);
(Continued)

(58) Field of Classification Search
CPC ........ G03F 7/002; G03F 7/165; G03F 7/0035; G03F 7/2016; G03F 7/11; G03F 7/40;
(Continued)

(56) References Cited

U.S. PATENT DOCUMENTS 8,828,747 B2 9/2014 Sato
2007/0298615 A1* 12/2007 Matsuzawa ............... G03F 7/40
438/694
(Continued)

FOREIGN PATENT DOCUMENTS

JP 2016-173415 9/2016

OTHER PUBLICATIONS

Seino, Y. et al. (2015). "A novel simple sib-15 nm line-and-space patterning process flow using directed self-assembly rechnology," *Microelectronic Engineering*, vol. 134; pp. 27-32, (2015).
(Continued)

*Primary Examiner* — Amanda C Walke
(74) *Attorney, Agent, or Firm* — Finnegan, Henderson, Farabow, Garrett & Dunner, LLP

(57) ABSTRACT

According to one embodiment, a pattern forming method includes forming a resist pattern on an under-layer, forming a recessed portion in the under-layer by etching the under-layer using the resist pattern as a mask, slimming the resist pattern, forming a neutral layer having an affinity for first and second polymers on a region of the under-layer not covered with the slimmed resist pattern, forming a block copolymer film containing the first polymer and the second polymer on the slimmed resist pattern and the neutral layer, and forming a microphase separation pattern comprising a first portion formed of the first polymer and a second portion formed of the second polymer by applying microphase separation processing to the block copolymer film.

20 Claims, 8 Drawing Sheets

(51) Int. Cl.
  *H01L 21/3105* (2006.01)
  *H01L 21/02* (2006.01)
  *G03F 7/00* (2006.01)
  *H01L 21/311* (2006.01)
  *B81C 1/00* (2006.01)
  *G03F 7/16* (2006.01)
  *G03F 7/11* (2006.01)
  *G03F 7/20* (2006.01)
  *H01L 21/033* (2006.01)

(52) U.S. Cl.
  CPC ........... *G03F 7/11* (2013.01); *G03F 7/165* (2013.01); *G03F 7/2016* (2013.01); *H01L 21/0271* (2013.01); *H01L 21/0273* (2013.01); *H01L 21/02118* (2013.01); *H01L 21/02318* (2013.01); *H01L 21/033* (2013.01); *H01L 21/0337* (2013.01); *H01L 21/31058* (2013.01); *H01L 21/31144* (2013.01); *B81C 2201/0149* (2013.01)

(58) Field of Classification Search
  CPC ........... H01L 21/0271; H01L 21/31144; H01L 21/0337; H01L 21/033; B81C 1/00031; B81C 2201/0149
  USPC .......... 430/322, 323, 324, 330, 331; 216/41; 438/311, 780, 947
  See application file for complete search history.

(56) References Cited

U.S. PATENT DOCUMENTS

| | | | | |
|---|---|---|---|---|
| 2008/0299774 A1* | 12/2008 | Sandhu | ............... | H01L 21/0337 438/696 |
| 2012/0103935 A1* | 5/2012 | Cheng | ................ | H01L 21/0337 216/37 |
| 2012/0107583 A1* | 5/2012 | Xiao | ..................... | G03F 7/0002 428/210 |
| 2013/0183827 A1* | 7/2013 | Millward | ............ | H01L 21/0273 438/694 |
| 2014/0072722 A1 | 3/2014 | Kawanishi et al. | | |
| 2014/0248439 A1 | 9/2014 | Sato et al. | | |
| 2014/0273472 A1* | 9/2014 | Somervell | ......... | H01L 21/31144 438/702 |
| 2014/0295669 A1* | 10/2014 | Kawanishi | .......... | H01L 21/0271 438/702 |
| 2014/0315390 A1* | 10/2014 | Abdallah | ............ | H01L 21/3081 438/703 |
| 2014/0322917 A1* | 10/2014 | Abdallah | ............ | H01L 21/3081 438/703 |
| 2015/0064917 A1* | 3/2015 | Somervell | .......... | H01L 21/0271 438/703 |
| 2015/0118625 A1* | 4/2015 | Yang | ..................... | B82Y 10/00 430/296 |
| 2015/0184017 A1* | 7/2015 | Hustad | ................. | C09D 133/08 438/703 |
| 2015/0287592 A1* | 10/2015 | Park | ...................... | G03F 7/0002 438/702 |
| 2016/0042965 A1* | 2/2016 | Ha | ....................... | H01L 21/0271 438/702 |
| 2016/0276167 A1 | 9/2016 | Seino | | |

OTHER PUBLICATIONS

Y. Seino, "Pattern Formation Method," U.S. Appl. No. 14/808,109, filed Jul. 24, 2015.

\* cited by examiner

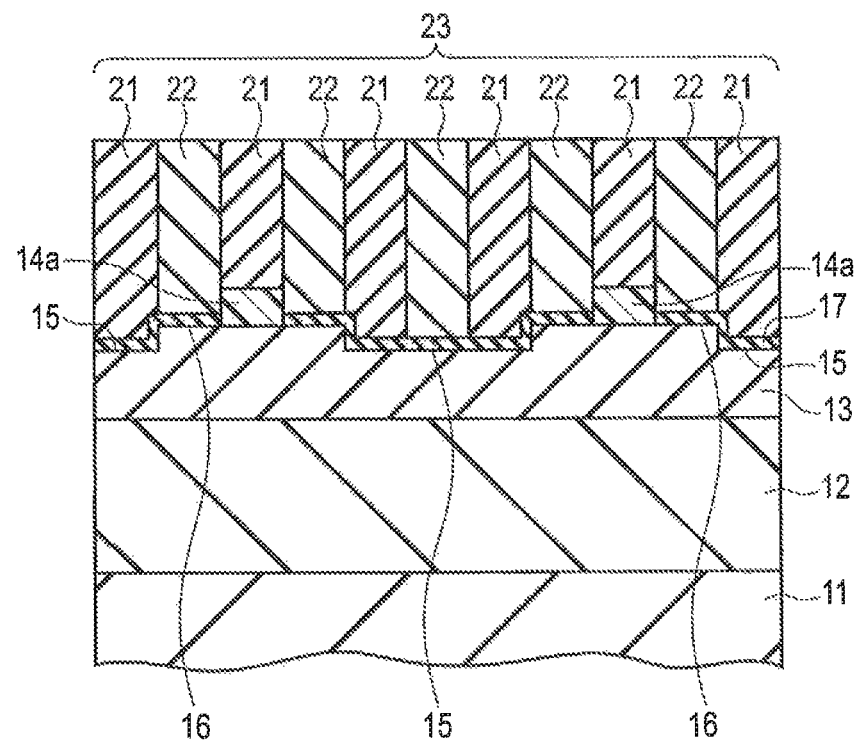
F I G. 1G
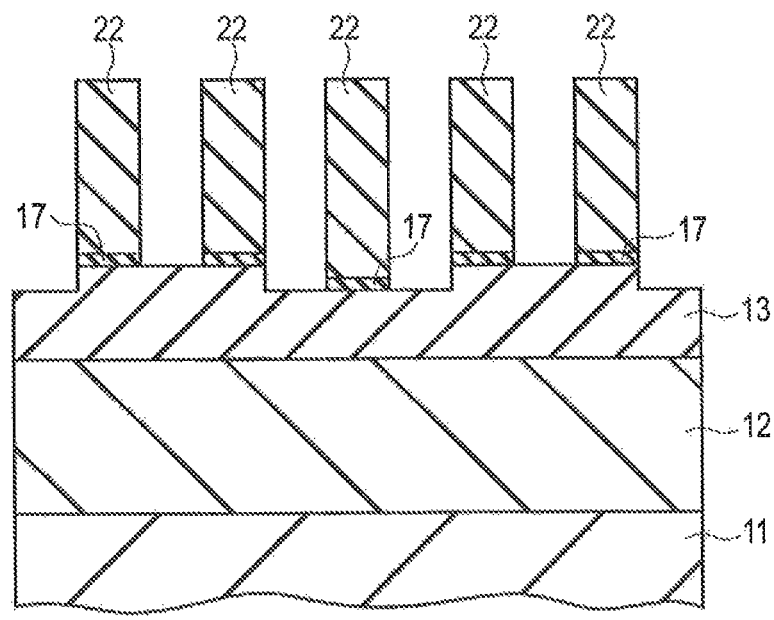
F I G. 1H

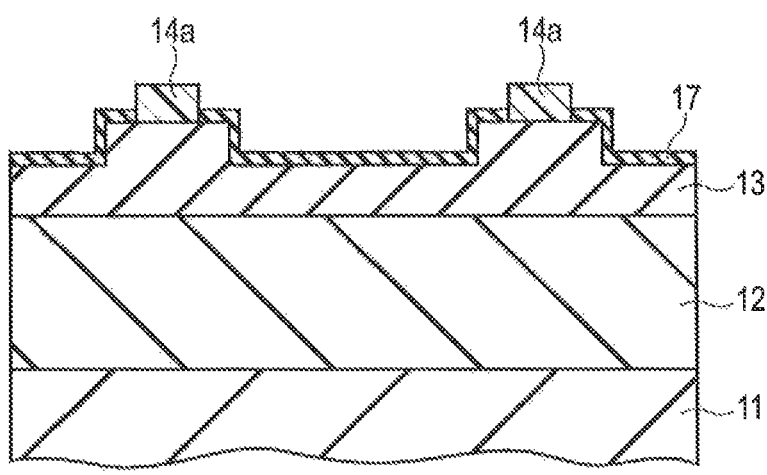
F I G. 3E
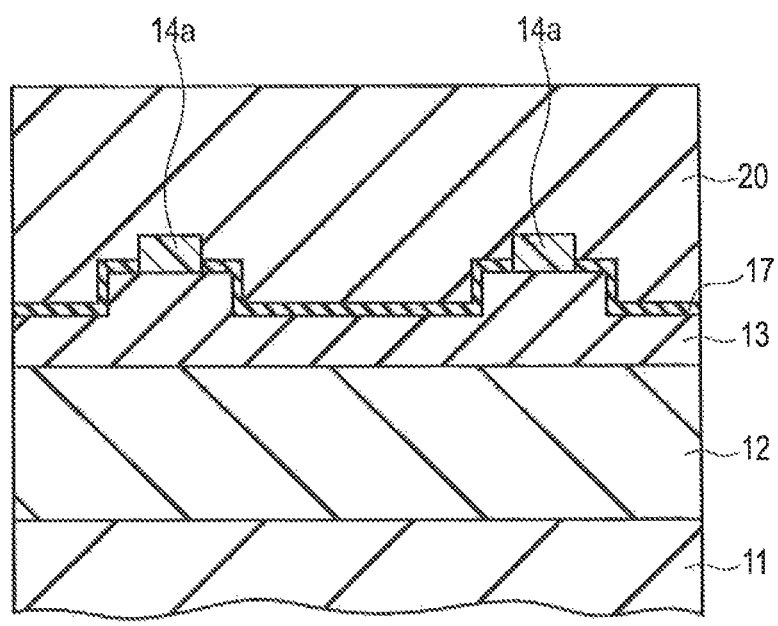
F I G. 3F

PATTERN FORMING METHOD

CROSS-REFERENCE TO RELATED APPLICATIONS

This application is based upon and claims the benefit of priority from Japanese Patent Application No. 2015-179535, filed Sep. 11, 2015, the entire contents of which are incorporated herein by reference.

FIELD

Embodiments described herein relate generally to a pattern forming method.

BACKGROUND

As a lithographic technique for a semiconductor device, a directed self-assembly (DSA) technique has been proposed. It is possible to form a fine pattern by the DSA technique.

However, in the case of performing lithography by the DSA technique, there are some cases where a pattern cannot be formed accurately.

BRIEF DESCRIPTION OF THE DRAWINGS

FIGS. 1A, 1B, 1C, 1D, 1E, 1F, 1G and 1H are sectional views schematically showing a part of a pattern forming method of the first embodiment.

FIGS. 3A, 3B, 3C, 3D, 3E, 3F, 3G and 3H are sectional views schematically showing a part of a pattern forming method of the second embodiment.

DETAILED DESCRIPTION

In general, according to one embodiment, a pattern forming method includes: forming a resist pattern on an under-layer; forming a recessed portion in the under layer by etching the under-layer using the resist pattern as a mask; slimming the resist pattern after forming the recessed portion in the under-layer; forming a neutral layer having an affinity for a first polymer and an affinity for a second polymer on a region of the under-layer not covered with the slimmed resist pattern; forming a block copolymer film containing the first polymer and the second polymer on the slimmed resist pattern and the neutral layer forming a microphase separation pattern comprising a first portion formed of the first polymer and a second portion formed of the second polymer by applying microphase separation processing to the block copolymer film; and removing one of the first portion and the second portion.

Various embodiments will be described hereinafter with reference to the accompanying drawings. Note that methods of the first and second embodiments, which will be described below, are applicable to a method of manufacturing a semiconductor device (semiconductor integrated circuit).

First Embodiment

FIGS. 1A to 1H are sectional views schematically showing a pattern forming method of the first embodiment. The pattern forming method of the present embodiment will be described below with reference to FIGS. 1A to 1H.

Figure 1A:
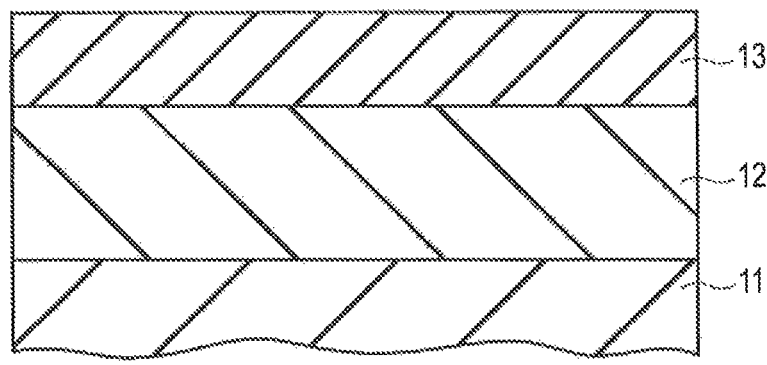

First, as shown in FIG. 1A, a spin-on-carbon (SOC) film 12 having a thickness of 150 nm is formed on a bottom structure 11 comprising a semiconductor substrate, a transistor, an insulating region and the like. The bottom structure 11 also comprises a to-be-processed film which is to be processed through a pattern formed by the method of the present embodiment. Then, an under-layer, namely, a spin-on-glass (SOG) film 13 having a thickness of 35 nm is formed on the SOC film 12.

Figure 1B:
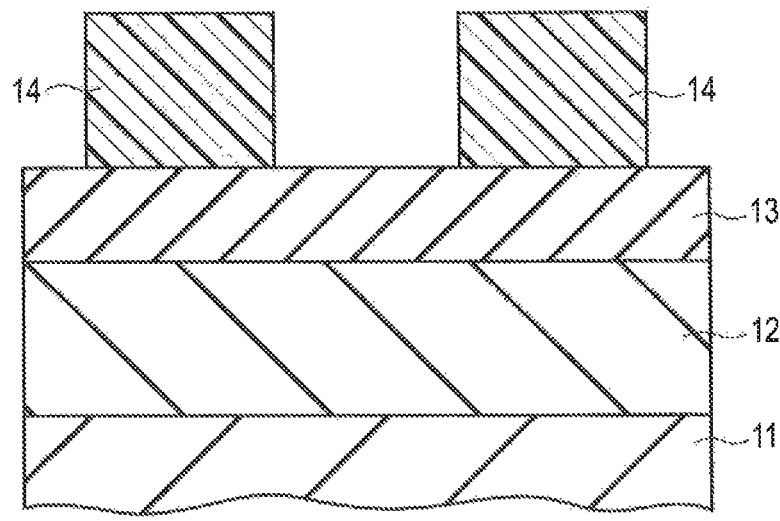

Then, as shown in FIG. 1B, a resist pattern 14 is formed on the SOG film 13. More specifically, a negative photoresist film is formed on the SOG film 13 first. In the case of using a negative photoresist, it is possible to easily form a resist pattern having narrow spaces. The photoresist film is then subjected to immersion lithography using an ArF excimer laser. After a developing process, a 45 nm half-pitch line-and-space pattern (L/S pattern), namely, the resist pattern 14 is obtained. The resist pattern 14 is formed of lines and spaces having the same width of 45 nm.

Figure 1C:
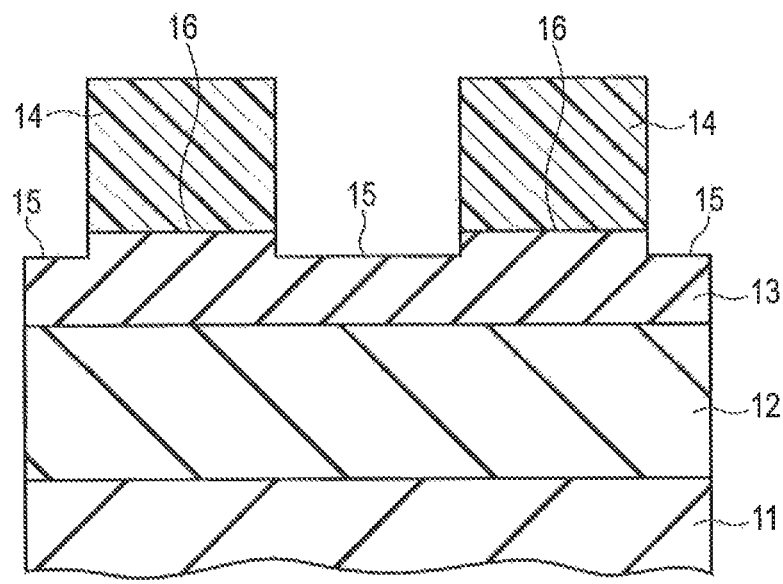

Subsequently, as shown in FIG. 1C, the SOG film 13 is etched through the resist pattern 14 used as a mask, and a recessed portion 15 is thereby formed on the SOG film 13. The portion of the SOG film 13 located under the resist pattern 14 become a raised portion 16. More specifically, the SOG film 13 is etched by reactive ion etching (RIE) using gaseous $CF_4$. The recessed portion 15 formed by the etching process has a depth of about 5 nm. In the etching process, since the resist film is sufficiently thick, the resist pattern 14 is hardly retrograded but remains in a rectangular shape. Therefore, it is possible to process the SOG film 13 vertically.

Figure 1D:
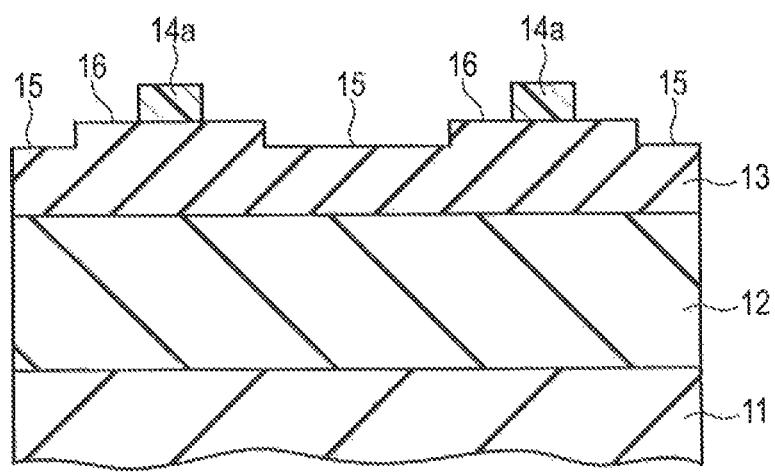

Then, as shown in FIG. 1D, the resist pattern 14 is slimmed. More specifically, the resist pattern 14 is slimmed down to a resist pattern 14a having a 15-nm line width by RIE using gaseous oxygen ($O_2$). In the slimming process, it is preferable to perform RIE under low bias to maintain the rectangular shape of the resist pattern 14 as much as possible. The surface of the slimmed resist pattern 14a has a higher affinity for polymethyl methacrylate (PMMA) (first polymer) than polystyrene (PS) (second polymer), which will be described later. That is, the surface of the slimmed resist pattern 14a functions as a PMMA pinning portion. The pinning portion is a portion which fixes either one of a PMMA portion and a PS portion in the microphase separation process of a block copolymer, which will be described later, but in the present embodiment, the pinning portion is assumed to fix the PMMA position to a position directly above the pinning portion.

In the above-described slimming process, to increase the affinity of the surface of the slimmed resist pattern 14a for PMMA, it is also possible to perform RIE using a gaseous mixture of oxygen ($O_2$) and at least one of nitrogen ($N_2$), hydrogen ($H_2$), argon (Ar), helium (He) and hydrogen bromide (HBr). More commonly, in the slimming process (RIE process), a gas containing at least one of oxygen ($O_2$), nitrogen ($N_2$), hydrogen ($H_2$), argon (Ar), helium (He) and hydrogen bromide (HBr) is used.

Further, to increase the affinity of the surface of the slimmed resist pattern 14a for PMMA, it is also possible to deposit a predetermined substance on the surface of the slimmed resist pattern 14a. The predetermined substance may be a substance containing carbon and fluorine. For example, a CF-based gas may be applied, and a CFx polymer may be deposited. By performing such a deposition process, it is possible not only to increase the affinity for PMMA but also to prevent the resist from being dissolved in a neutral layer formation process, which will be described later.

Figure 1E:
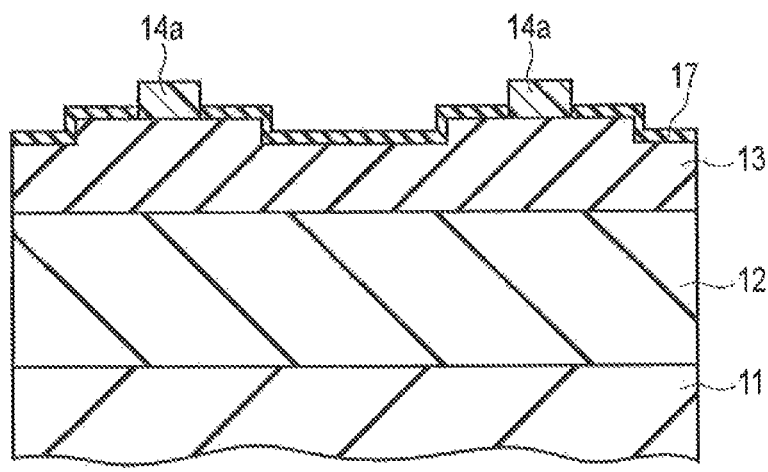

Then, as shown in FIG. 1E, a neutral layer 17 having an affinity for polymethyl methacrylate (PMMA) (first Polymer) and an affinity for polystyrene (PS) (second polymer) is formed on a region of the SOG film 13 not covered with the slimmed resist pattern 14a. More specifically, a film preliminary to forming the neutral layer 17 is formed on the entire surface, and then the preliminary film is made to react with the SOG film 13. Further, a portion of the preliminary film that has not reacted with the SOG film 13 is removed, and the neutral layer 17 selectively formed on the SOG film 13 is obtained.

Figure 1F:
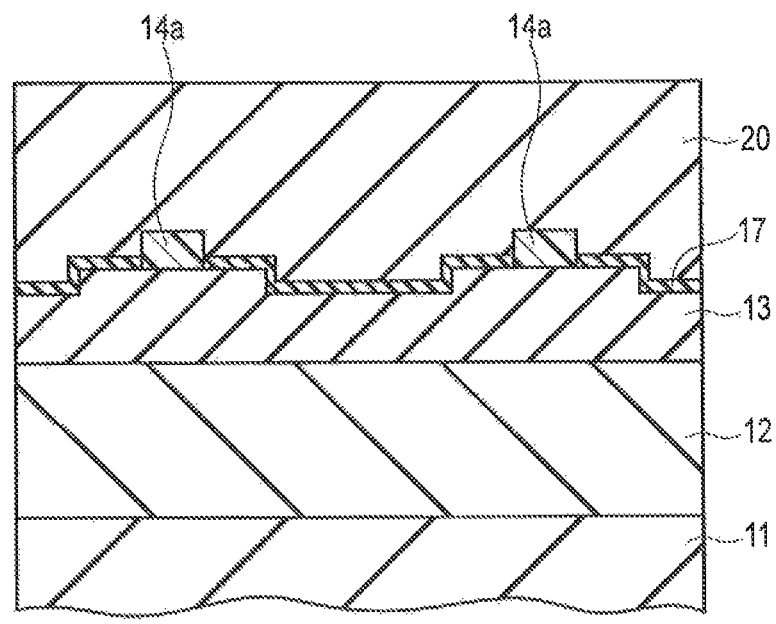
Figure 2:
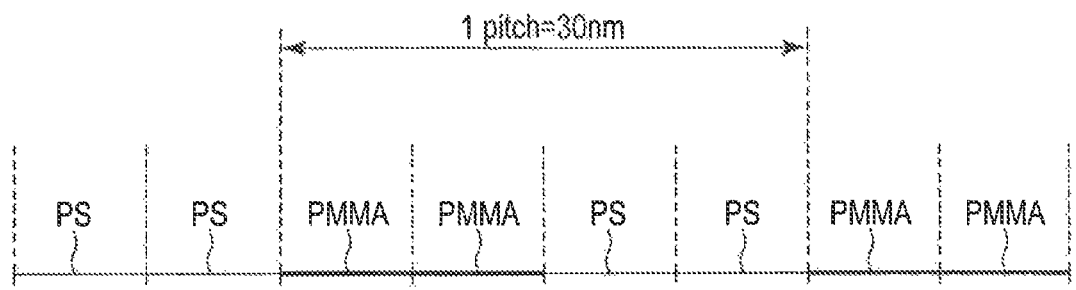
FIG. 2 is a diagram schematically showing the structure of a block copolymer.

Subsequently, as shown in FIG. 1F, a block copolymer film 20 containing PMMA and PS is formed on the slimmed resist pattern 14a and the neutral layer 17. More specifically, a solution containing a polystyrene-b-poly (methyl methacrylate) (PS-b-PMMA) block copolymer is applied to the slimmed resist pattern 14a and the neutral layer 17. PS-b-PMMA contains PMMA and PS in the volume composition ratio of 1:1. Further, the block copolymer has a 30-nm pitch. FIG. 2 is a diagram schematically showing the structure of the block copolymer. As shown in FIG. 2, the pitch of the block copolymer is defined by two PMMA blocks and two PS blocks.

Then, as shown in FIG. 1G, the block copolymer film 20 undergoes microphase separation, and thereby a microphase separation pattern 23 comprising a PMMA portion 21 formed of PMMA (first polymer) and a PS portion 22 formed of PS (second polymer) is formed. More specifically, the block copolymer film 20 is thermally processed in an atmosphere of gaseous nitrogen ($N_2$) at 240° C. for two minutes, and thereby the microphase separation pattern 23 is obtained. That is, the microphase separation pattern 23 in which the PMMA portion 21 and the PS portion 22 are arranged in an alternating manner and the PMMA portion 21 is provided on the slimmed resist pattern 14a (pinning portion) is obtained. One PMMA portion 21 is formed of two PMMA blocks, and one PS portion 22 is formed of two PS blocks. Therefore, one PMMA portion 21 has a 15 nm width, and one PS portion 22 has a 15 nm width.

Now, the microphase separation pattern 23 will be described in detail. The neutral layer 17 contains the composition of PMMA and the composition of PS. Therefore, the water contact angle of the neutral layer 17 is an angle intermediate between the water contact angle of PMMA and the water contact angle of PS. Consequently, both PMMA and PS have affinities to the neutral layer. On the other hand, the surface of the slimmed resist pattern 14a has a higher affinity for PMMA than PS and thus functions as a PMMA pinning portion. Therefore, PMMA is preferentially attached to the surface of the slimmed resist pattern 14a. Further, the block copolymer is formed of a PMMA molecule and a PS molecule bonded together. Here, a PMMA molecule is bonded to another PMMA molecule, while a PS molecule is bonded to another PS molecule. Therefore, an arrangement of PMMA-PMMA-PS-PS-PMMA-PMMA-PS-PS is obtained by the above-described thermal processing.

In the present embodiment, the arrangement of the microphase separation pattern 23 can be defined by the slimmed resist pattern 14a and a step of the SOG film (under-layer) 13 (step between the recessed portion 15 and the raised portion 16). Therefore, it is possible to form the microphase separation pattern 23 with excellent arrangement controllability by accurately adjusting the relationship between the widths and pitches of the respective patterns (such as the slimmed resist pattern 14a, the pattern of the recessed portion 15 and the pattern of the raised portion 16) and the pitch of the block copolymer.

Then, as shown in FIG. 1H, either one of the PMMA portion 21 and the PS portion 22 is removed. In the present embodiment, the PMMA portion 21 is assumed to be removed selectively. For example, the PMMA portion 21 is removed by RIE using gaseous oxygen ($O_2$). At this time, the neutral layer 17 and the resist pattern 14a under the PMMA portion 21 are also removed. In this way, a line-and-space (L/S) pattern formed of the PS portion 22 and having a 15-nm half-pitch is obtained.

Although the subsequent processes are not shown in the drawings, the SC film 13 is etched through the pattern of the PS portion 22 used as a mask, and the SOC film 12 is then etched through the pattern of the SOG film 13 used as a mask. In this way, the pattern of the PS portion 22 is transferred to the SOG film 13 and the SOC film 12. Further, the to-be-processed film in the bottom structure 11 is etched through the patterns of the SOG film 13 and the SOC film 12 used as masks, and thereby a fine line-and-space pattern (L/S pattern) is obtained.

As described above, in the present embodiment, the resist pattern 14 is used as a mask for etching the SOG film 13 and forming the recessed portion 15 in the SOG film 13 in the process of FIG. 1C. In the etching process, since the resist film is sufficiently thick, it is possible to maintain the rectangular shape of the resist pattern 14 and process the SOG film 13 vertically.

If the slimmed resist pattern is used as a mask for etching the SOG film and forming the recessed portion in the SOG film, the resist film is too thin to form the recessed portion accurately in the SOG film. That is, since the resist pattern to be used as a mask is thin, the recessed portion and the raised portion of the SOG film obtained by the etching process are likely to be tapered at the edges and are also likely to be formed in more various dimensions. As a result, there are some cases where the microphase separation pattern cannot be formed in a desired position.

In the present embodiment, the pre-slimmed resist pattern 14 is used as a mask for etching the SOG film 13, but the slimmed resist pattern 14a will not be used as a mask for etching the SOG film 13. Therefore, it is possible to solve the above-described issue and thereby form the recessed portion pattern accurately in the SOG film 13. Consequently, a microphase separation pattern having an excellent shape and high dimensional accuracy can be formed in a desired position.

Further, in the present embodiment, the arrangement of the microphase separation pattern 23 can be defined by the slimmed resist pattern 14a and the step of the SOG film (under-layer) 13 (step between the recessed portion 15 and the raised portion 16). Therefore, it is possible to form a microphase separation pattern having an excellent shape and high dimensional accuracy by adjusting the relationship between the widths and pitches of the respective patterns (such as the slimmed resist pattern 14a, the pattern of the recessed portion 15 and the pattern of the raised portion 16) and the pitch of the block copolymer accurately.

Still further, in the present embodiment, since the surface of the slimmed resist pattern 14a is subjected to processing which increases an affinity for PMMA and thus the surface of the slimmed resist pattern 14a can perform the function of a pinning portion more adequately, a microphase separation pattern having an excellent shape and high dimensional accuracy can be formed more reliably.

Second Embodiment

FIGS. 3A to 3H are sectional views schematically showing a pattern forming method of the second embodiment. Note that, since basic points are similar to those of the first embodiment, detailed descriptions thereof which have already been described in the first embodiment will be omitted.

Figure 3A:
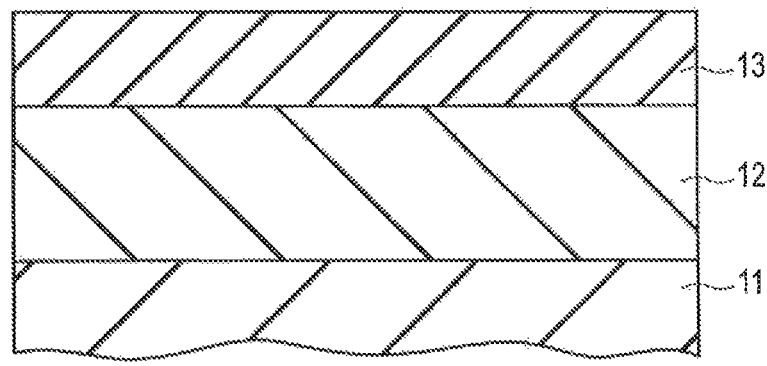

First, as shown in FIG. 3A, an SOC film 12 and an SOG film 13 are formed on a bottom structure 11 in a manner similar to that of the first embodiment. The SOC film 12 and the SOG film 13 have thicknesses the same as those of the first embodiment.

Figure 3B:
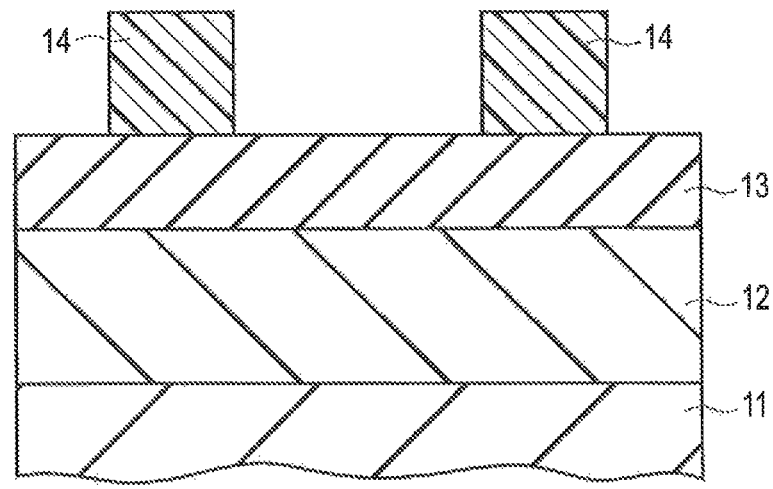

Then, as shown in FIG. 3B, a resist pattern 14 is formed on the SOG film 13 in a manner similar to that of the first embodiment using a negative photoresist. Note that the resist pattern 14 has a 30 nm line width and a 60 nm space width in the present embodiment.

Figure 3C:
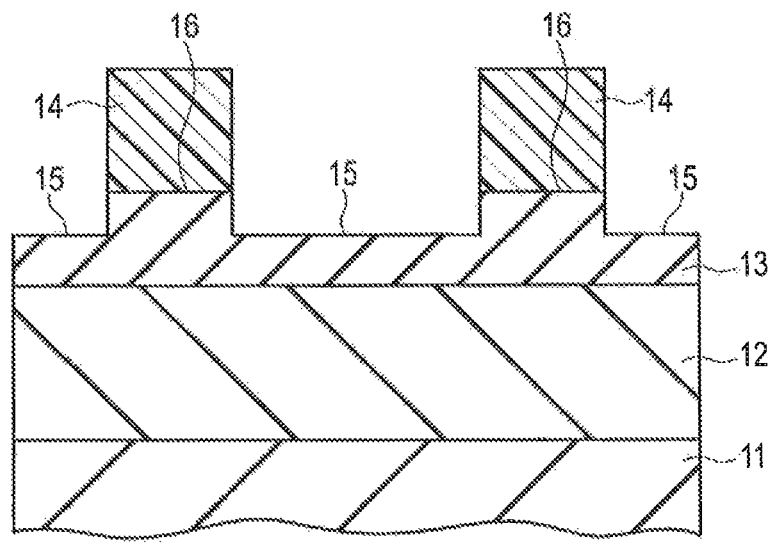

Subsequently, as shown in FIG. 3C, the SOG film 13 is etched through the resist pattern 14 used as a mask, and a recessed portion 15 and a raised portion 16 are thereby formed in the SOG film 13 in a manner similar to that of the first embodiment. Note that, in the present embodiment, the recessed portion 1 has a depth of about 15 nm, which is greater than that of the first embodiment.

Figure 3D:
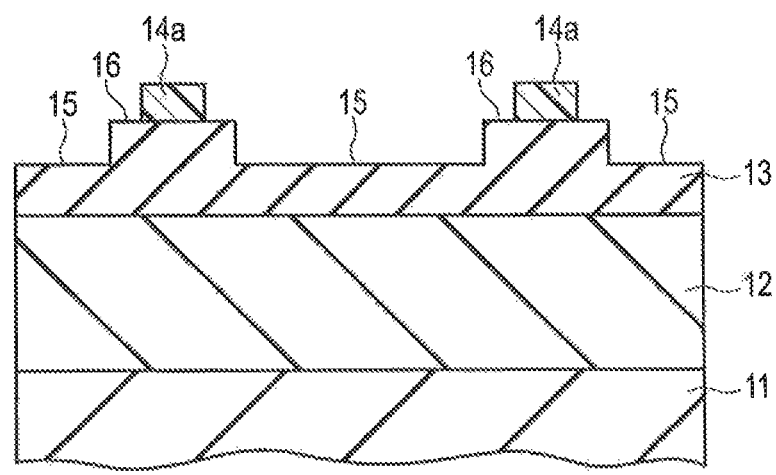

Then, as shown in FIG. 3D, the resist pattern 14 is slimmed down to a resist pattern 14a having a 15 nm line width in a manner similar to that of the first embodiment. As in the case of the first embodiment, the surface of the slimmed resist pattern 14a has a higher affinity for PMMA (first polymer) than PS (second polymer) and thus functions as a PMMA pinning portion.

Note that it is also possible to apply processing which increases the affinity of the slimmed resist pattern 14a for PMMA in a manner similar to that of the first embodiment.

Then, as shown in FIG. 3E, a neutral layer 17 having an affinity for PMMA and an affinity for PS is formed on a region of the SOG film 13 not covered with the slimmed resist pattern 14a in a manner similar to that of the first embodiment.

Subsequently, as shown in FIG. 3F, a block copolymer film 20 containing PMMA and PS is formed on the slimmed resist pattern 14a and the neutral layer 17 in a manner similar to that of the first embodiment. The block copolymer has a 30-nm pitch as in the case of the first embodiment.

Figure 3G:
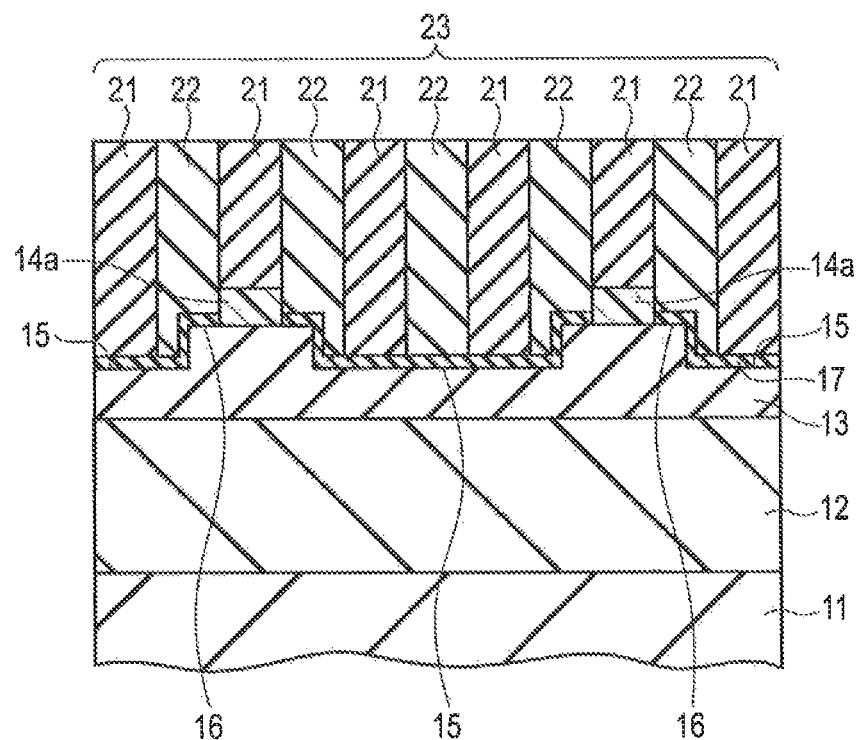

Then, as shown in FIG. 3G, the block copolymer film 20 undergoes microphase separation, and a microphase separation pattern 23 comprising a PMMA portion 21 formed of PMMA (first polymer) and a PS portion 22 formed of PS (second polymer) is thereby formed in a manner similar to that of the first embodiment. That is, the microphase separation pattern 23 in which the PMMA portion 21 and the PS portion 22 are arranged in an alternating manner and the PMMA portion 21 is provided on the slimmed resist pattern 14a (pinning portion) is obtained. One PMMA portion 21 has a 15 nm width, and one PS portion 22 has a 15 nm width.

Also in the present embodiment, PMMA is preferentially attached to the surface of the slimmed resist pattern 14a in a manner similar to that of the first embodiment. As a result, the microphase separation pattern 23 in which the PMMA portion 21 and the PS portion 22 are arranged in an alternating manner and the PMMA portion 21 is provided on the slimmed resist pattern 14a is obtained in a manner similar to that of the first embodiment.

Further, also in the present embodiment, the arrangement of the microphase separation pattern 23 can be defined by the slimmed resist pattern 14a. Therefore, it is possible to form the microphase separation pattern 23 with excellent arrangement controllability by accurately adjusting the relationship between the width and pitch of the slimmed resist pattern 14a and the pitch of the block copolymer.

Still further, in the present embodiment, by accurately adjusting the relationship between the widths and pitches of the respective patterns (such as the slimmed resist pattern 14a, the pattern of the recessed portion 15 and the pattern of the raised portion 16) and the pitch of the block copolymer, it is possible to make the proportion (volume proportion) of the PMMA portions 21 and the proportion (volume proportion) of the PS portions 22 on the recessed portion 15 equal to each other and make the proportion (volume proportion) of the PMMA portions 21 and the proportion (volume proportion) of the PS portions 22 in the raised portion 16 equal to each other. In this way, it is possible to prevent the arrangement of PMMA and PS from being disarranged and thereby form the microphase separation pattern 23 with excellent arrangement controllability.

Figure 3H:
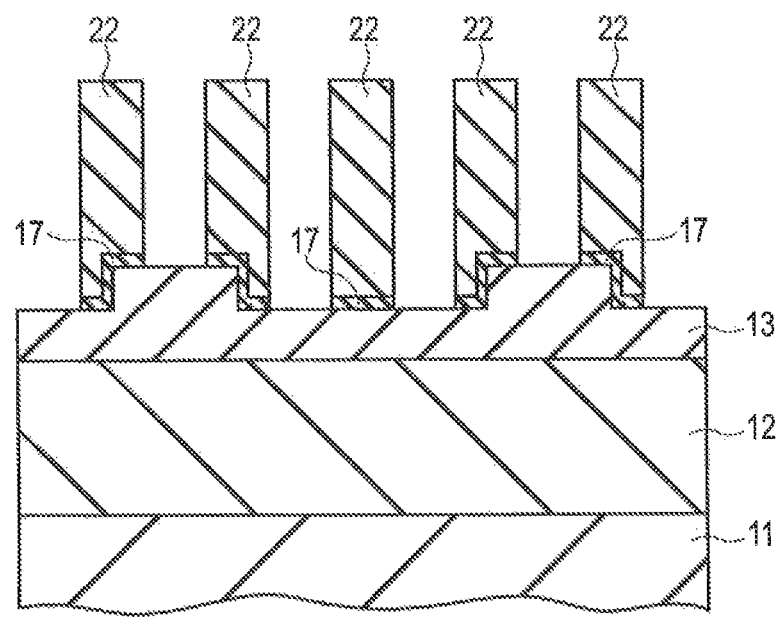

Next, as shown in FIG. 3H, either one of the PMMA portion 21 and the PS portion 22 is removed in a manner similar to that of the first embodiment. In the present embodiment, the PMMA portion 21 is assumed to be removed selectively. As a result, a 15-nm half-pitch line-and-space pattern (L/S pattern) is obtained.

Although the subsequent processes are not shown in the drawings, the SOG film 13 is etched through the pattern of the PS portion 22 used as a mask, and the SOC film 12 is then etched through the pattern of the SOG film 13 used as a mask. In this way, the pattern of the PS portion 22 is transferred to the SOG film 13 and the SOC film 12. Further, the to-be-processed film in the bottom structure 11 is etched through the patterns of the SOG film 13 and the SOC film 12 used as masks, and thereby a fine line-and-space pattern (L/S pattern) is obtained.

Also in the present embodiment, as described above, the pre-slimmed resist pattern 14 is used as a mask for etching the SOG film 13, but the slimmed resist pattern 14a will not be used as a mask for etching the SOG film 13 as in the case of the first embodiment. Therefore, also in the present embodiment, it is possible to form the pattern of a recessed portion accurately in the SOG film 13 and form a microphase separation pattern having en excellent shape and high dimensional accuracy in a desired position in a manner similar to that of the first embodiment.

Further, in the present embodiment, it is possible to make the proportion (volume proportion) of the PMMA portions 21 and the proportion (volume proportion) of the PS portions 22 equal to each other both in the recessed portion 15 and in the raised portion 16. In this way, the arrangement of PMMA and PS will not be disarranged, and thus the microphase separation pattern 23 can be formed with excellent arrangement controllability.

Still further, since it is also possible to prevent the disarrangement of PMMA and PS by increasing the depth of the recessed portion 15 in the present embodiment, the microphase separation pattern 23 can be more reliably formed with excellent arrangement controllability.

Still further, also in the present embodiment, since the surface of the slimmed resist pattern 14a is subjected to processing which increases an affinity for PMMA and thus the surface of the slimmed resist pattern 14a can perform the function of a pinning portion more adequately in a manner similar to that of the first embodiment, a microphase separation pattern having an excellent shape and high dimensional accuracy can be formed.

Note that, in the process of FIG. 3B of the present embodiment, the resist pattern 14 having a 30 nm line width may also be formed by a slimming technique. More specifically, a resist pattern having a line width and a space width of 45 nm is formed by lithography. Then, the resist pattern having a 45 nm line width is slimmed down to the resist pattern 14 having a 30 nm line width and a 60 nm space width.

The above are the descriptions of the first and second embodiments, but the first and second embodiments can be modified as follows.

Although the pitch (90 nm) of the resist pattern 14 has been assumed to be three times the pitch (30 nm) of the block copolymer in the first and second embodiments, the pitch of the resist pattern 14 can generally be two or more integral multiple of the pitch of the block copolymer. Note that, to arrange the block copolymer easily, the pitch of the resist pattern 14 should preferably be six or less integral multiple of the pitch of the block copolymer.

Further, although the line width (15 nm) of the slimmed resist pattern 14a has been assumed to be equal to the half-pitch of the block copolymer in the first and second embodiments, the line width of the slimmed resist pattern 14a can generally be an integral multiple (especially, an odd multiple) of the half pitch of the block copolymer.

Still further, although the line width (45 nm) of the resist pattern 14 has been assumed to be three times the half-pitch (15 nm) of the block copolymer in the first embodiment, in the case of defining the arrangement of the microphase separation pattern 23 by the slimmed resist pattern 14a and the step of the SOG film (under-layer) 13 (step between the recessed portion 15 and the raised portion 16), the line width of the resist pattern 14 can generally be three or more odd multiple of the half-pitch of the block copolymer. Still further, although the line width (30 nm) of the resist pattern 14 has been assumed to be twice the half-pitch (15 nm) of the block copolymer in the second embodiment, in the case of making the proportion (volume proportion) of the PMMA portions 21 and the proportion (volume proportion) of the PS portions 22 equal to each other both in the recessed portion 15 and in the raised portion 16, the line width of the resist pattern 14 can generally be two or more even multiple of the half-pitch of the block copolymer. More commonly, the line width of the resist pattern 14 can be two or more integral multiple of the half-pitch of the block copolymer.

Still further, although the space width (45 nm) of the resist pattern 14 has been assumed to be three times the half-pitch (15 nm) of the block copolymer in the first embodiment, in the case of defining the arrangement of the microphase separation pattern 23 by the slimmed resist pattern 14a and the step of the SOG film (under-layer) 13 (step between the recessed portion 15 and the raised portion 16), the space width of the resist pattern 14 can generally be three or more odd multiple of the half-pitch of the block copolymer. Still further, although the space width (60 nm) of the resist pattern 14 has been assumed to be four times the half-pitch (15 nm) of the block copolymer in the second embodiment, in the case of making the proportion (volume proportion) of the PMMA portions 21 and the proportion (volume proportion) of the PS portions 22 equal to each other both in the recessed portion 15 and in the raised portion 16, the space width of the resist pattern 14 can generally be two or more even multiple of the half-pitch of the block copolymer. More commonly, the space width of the resist pattern 14 can be two or more integral multiple of the half-pitch of the block copolymer.

Still further, although the resist pattern 14 has been assumed to be formed of a negative resist in the above described first and second embodiment, the resist pattern 14 may also be formed of a positive resist.

Still further, although the resist pattern 14 has been assumed to be formed by ArF immersion lithography in the first and second embodiments, the resist pattern 14 may also be formed by extreme ultraviolet photolithography or nanoimprint lithography.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming an under-layer on a substrate including a semiconductor substrate;
    forming a resist film on the under-layer;
    forming a resist pattern by patterning the resist film,
    forming a recessed portion in the under-layer by etching the under-layer using the resist pattern as a mask;
    slimming the resist pattern after forming the recessed portion in the under-layer;
    forming a neutral layer having an affinity for a first polymer and an affinity for a second polymer on a region of the under-layer not covered with the slimmed resist pattern;
    forming a block copolymer film containing the first polymer and the second polymer on the slimmed resist pattern and the neutral layer;
    forming a microphase separation pattern comprising a first portion formed of the first polymer and a second portion formed of the second polymer by applying microphase separation processing to the block copolymer film; and
    removing one of the first portion and the second portion.

2. The method of claim 1, wherein
    the first portion and the second portion are arranged in an alternating manner.

3. The method of claim 1, wherein the first portion is provided on the slimmed resist pattern.

4. The method of claim 1, wherein a surface of the slimmed resist pattern has a higher affinity for the first polymer than the second polymer.

5. The method of claim 1, wherein slimming the resist pattern is performed using a gas containing at least one of an oxygen gas, a nitrogen gas, a hydrogen gas, an argon gas, a helium gas and a hydrogen bromide gas.

6. The method of claim 1, wherein slimming the resist pattern is performed using a gaseous mixture of an oxygen gas and at least one of a nitrogen gas, a hydrogen gas, an argon gas, a helium gas and a hydrogen bromide gas.

7. The method of claim 1 further comprising applying processing which increases an affinity for the first polymer to a surface of the slimmed resist pattern.

8. The method of claim 7, wherein the processing includes depositing a predetermined substance on the surface of the slimmed resist pattern.

9. The method of claim 8, wherein the predetermined substance contains carbon and fluorine.

10. The method of claim 1, wherein the first polymer is polymethyl methacrylate (PMMA) and the second polymer is polystyrene (PS).

11. The method of claim 1, wherein forming the microphase separation pattern includes applying thermal processing to the block copolymer film.

12. The method of claim 1, wherein the resist pattern is formed of a negative resist.

13. The method of claim 1, wherein removing the one of the first portion and the second portion includes forming a line-and-space pattern.

14. The method of claim 1, wherein the resist pattern is a line-and-space pattern.

15. The method of claim 1, wherein a pitch of the resist pattern is two or more integral multiple of a pitch of a block copolymer constituting the block copolymer film.

16. The method of claim 1, wherein a line width of the slimmed resist pattern is an integral multiple of a half-pitch of a block copolymer constituting the block copolymer film.

17. The method of claim 1, wherein a line width of the resist pattern is two or more integral multiple of a half-pitch of a block copolymer constituting the block copolymer film.

18. The method of claim 1, wherein a space width of the resist pattern is two or more integral multiple of a half-pitch of a block copolymer constituting the block copolymer film.

19. The method of claim 1, wherein a line width of the resist pattern is three or more odd multiple of a half-pitch of a block copolymer constituting the block copolymer film.

20. The method of claim 1, wherein a line width of the resist pattern is two or more even multiple of a half-pitch of a block copolymer constituting the block copolymer film.

* * * * *